United States Patent
Li et al.

(10) Patent No.: US 8,981,844 B2
(45) Date of Patent: Mar. 17, 2015

(54) NARROW VOLTAGE RANGE MULTI-LEVEL OUTPUT PULSE MODULATED AMPLIFIER WITH ONE-BIT HYSTERESIS QUANTIZER

(71) Applicants: Dan Li, Shanghai (CN); Jinhua Ni, Shanghai (CN)

(72) Inventors: Dan Li, Shanghai (CN); Jinhua Ni, Shanghai (CN)

(73) Assignee: Analog Devices Global, Hamilton (BM)

( * ) Notice: Subject to any disclaimer, the term of this patent is extended or adjusted under 35 U.S.C. 154(b) by 87 days.

(21) Appl. No.: 13/738,450

(22) Filed: Jan. 10, 2013

(65) Prior Publication Data

US 2014/0191802 A1    Jul. 10, 2014

(51) Int. Cl.
*H03F 3/38* (2006.01)
*H03F 3/217* (2006.01)

(52) U.S. Cl.
CPC .............. *H03F 3/2171* (2013.01); *H03F 3/217* (2013.01)
USPC ............................................. 330/10; 330/251

(58) Field of Classification Search
USPC ........................................ 330/10, 251, 207 A
See application file for complete search history.

(56) References Cited

U.S. PATENT DOCUMENTS

| 6,492,868 | B2 | 12/2002 | Kirn |
| 7,518,348 | B1 | 4/2009 | Kobayashi |
| 8,212,612 | B2 * | 7/2012 | Song et al. ....................... 330/10 |
| 8,643,436 | B2 * | 2/2014 | Ni et al. ......................... 330/251 |
| 2006/0197590 | A1 * | 9/2006 | Wang et al. ....................... 330/10 |
| 2006/0202754 | A1 | 9/2006 | Yamamura et al. |
| 2007/0040608 | A1 * | 2/2007 | Magrath et al. ................. 330/10 |
| 2009/0072897 | A1 | 3/2009 | Chang et al. |
| 2012/0049930 | A1 | 3/2012 | Han |
| 2012/0223772 | A1 | 9/2012 | Cerutti |
| 2013/0021096 | A1 * | 1/2013 | Sugawara et al. ............. 330/251 |
| 2013/0120063 | A1 * | 5/2013 | Lesso ............................ 330/251 |

FOREIGN PATENT DOCUMENTS

JP          2007-036736         2/2007

OTHER PUBLICATIONS

International Search Report and Written Opinion of the International Searching Authority in counterpart International application No. PCT/IB2014/000020, communication dated Mar. 14, 2014.

* cited by examiner

*Primary Examiner* — Khanh V Nguyen
(74) *Attorney, Agent, or Firm* — Kenyon & Kenyon, LLP

(57) ABSTRACT

An amplifier system may include a power stage having inputs for three different supply voltages and an output for coupling to a load, a controller to generate control signals to the power stage that cause the power stage to vary an output voltage applied to the load among more than three distinct voltage levels, a monitor to provide a first control signal to the controller based on an input voltage signal, and a feedback system to provide a second control signal to the controller based on comparison of the output voltage and the input signal.

30 Claims, 4 Drawing Sheets

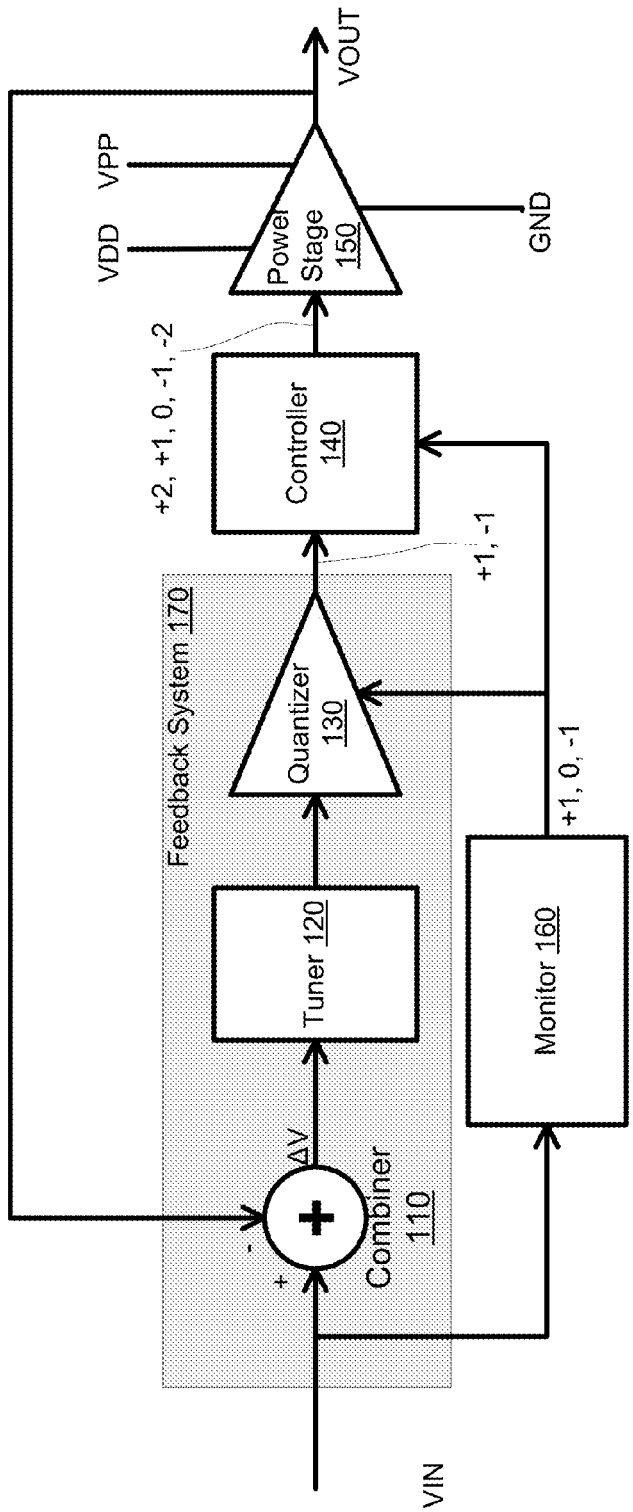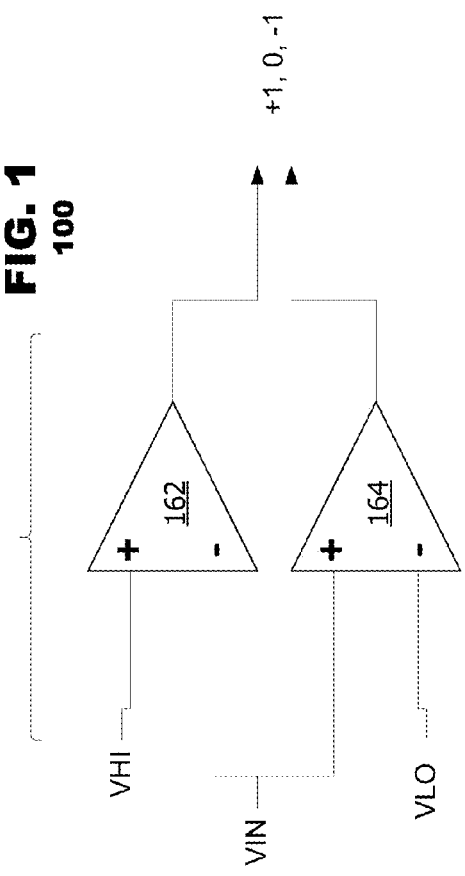
FIG. 1
100

300

400

NARROW VOLTAGE RANGE MULTI-LEVEL OUTPUT PULSE MODULATED AMPLIFIER WITH ONE-BIT HYSTERESIS QUANTIZER

BACKGROUND

In an amplifier, for example, a boost Class D amplifier, an output voltage may be modulated at five voltage levels based upon an analog input voltage level. The amplifier may include quantizers to perform pulse-density modulation (PDM) to allow the amplifier to encode the output voltage as a sequence of pulses at the five voltage levels, for example, at $+V_{PP}$, $+V_{DD}$, GND, $-V_{DD}$, and $-V_{PP}$, where $V_{PP} > V_{DD}$.

A single one-bit hysteresis quantizer-based amplifier can modulate the output at three voltage levels, for example, $+V_{DD}$, GND, and $-V_{DD}$, which would be insufficient for the five voltage levels in the output of a boost Class D amplifier. If multiple one-bit hysteresis quantizers are used, the modulator can encode the output voltage at the five voltage levels. However, this would degrade the output linearity and increase the complexity of comparator design of the quantizers. Additionally, the performance of the amplifier would become more sensitive to process and layout variations.

One conventional solution is to switch the range of the modulation output voltage between a normal mode of modulating between three voltage levels of $+V_{DD}$, GND, and $-V_{DD}$, and a boost mode of modulating between three voltage levels of $+V_{PP}$, GND, and $-V_{PP}$. When the input voltage is determined to be sufficiently low, the amplifier is placed in normal mode by modulating the output between three voltage levels of $+V_{DD}$, GND, and $-V_{DD}$. When the input voltage is determined to be sufficiently high, the amplifier is placed in boost mode by modulating the output between three voltage levels of $+V_{PP}$, GND, and $-V_{PP}$.

This solution may be implemented by sensing the input voltage, and switching the supply voltage between $V_{DD}$ and $V_{PP}$, at the output power stage, depending on the mode. In other words, when in the normal mode, the booster is turn off, and the output voltage is modulated between three voltage levels of $+V_{DD}$, GND, and $-V_{DD}$. When in the boost mode, the booster is turned on quickly, and the output voltage is modulated between three voltage levels of $+V_{PP}$, GND, and $-V_{PP}$.

However, because the output voltage is modulated in a greater voltage range in the boost mode than in the normal mode, this solution imposes difficult requirements for the booster to meet, namely, to charge and discharge the required voltage quickly. The booster is subject to high voltage and current stresses during charging and discharging, and would have greater probability of stress failure. Designing the booster to withstand the stresses would increase the complexity of the amplifier.

Additionally, because the output voltage is modulated in a greater voltage range in the boost mode than in the normal mode, the modulation in the boost mode would also generate greater amount of electro-magnetic interference (EMI), which would interfere with other electronic devices or components nearby. Again, designing the electronic devices or components to withstand the EMI would increase the complexity of design.

Furthermore, when the output voltage is modulated in a greater voltage range in the boost mode, all the output power of the Class D amplifier is supplied by the booster. This would cause a high amount of power consumption.

Additionally, because the quantization error of the PDM is dependent upon the amplitude of the output pulses, when the output voltage is modulated in a greater voltage range in the boost mode than in the normal mode, the boost mode would produce higher quantization error than the normal mode.

Accordingly, there is a need for a voltage boosted Class D amplifier having increased power efficiency, less stress on the amplifier components, less EMI generation, and lower quantization error.

BRIEF DESCRIPTION OF THE DRAWINGS

FIG. 1 illustrates an amplifier according to an embodiment of the present disclosure.

DETAILED DESCRIPTION

Figure 2:
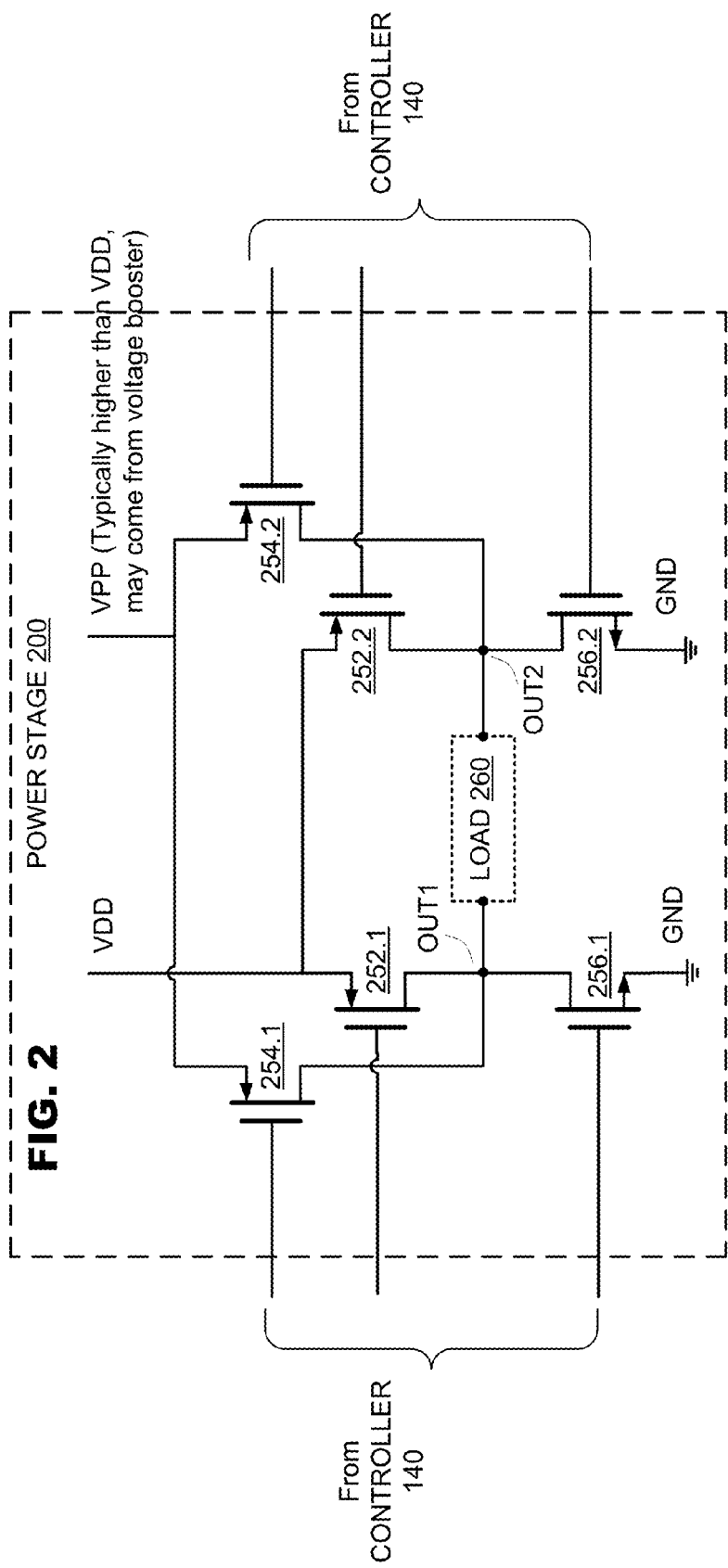
FIG. 2 illustrates a power stage according to an embodiment of the present disclosure.

Embodiments of the present disclosure provide devices and techniques to generate an output signal in an amplifier. Accordingly, such devices may include a power stage having inputs for three different supply voltages and an output for coupling to a load; a controller to generate control signals to the power stage that cause the power stage to vary an output voltage applied to the load among more than three distinct voltage levels; a monitor to provide a first control signal to the controller based on an input voltage signal; and a feedback system to provide a second control signal to the controller based on comparison of the output voltage and the input signal.

FIG. 1 illustrates an amplifier system 100 according to an embodiment of the present disclosure. The system 100 may include a power stage 150, a controller 140, a monitor 160 and a feedback system 170. The power stage 150 may deliver a pulse-modulated (PM) voltage $V_{OUT}$ to an output terminal of the system that toggles among five voltage levels. The controller 140 may control operation of the power stage 150 to regulate the output voltage therefrom. The monitor 160 may monitor a voltage $V_{IN}$ presented at an input terminal of the system 100 and present control data to the controller 140. The feedback system 170 may develop second control data to the controller 140 based on a comparison between the input voltage $V_{IN}$ and output voltage $V_{OUT}$.

As illustrated in FIG. 1, an amplifier system 100 may include a power stage 150 having inputs for three different supply voltages (for example, $V_{DD}$, $V_{PP}$, and GND) and an output for coupling to a load (not shown), a controller 140 to generate control signals to the power stage 150 that cause the power stage 150 to vary an output voltage applied to the load (not shown) among more than three distinct voltage levels, a monitor 160 to provide a first control signal to the controller 140 based on an input voltage signal, and a feedback system 170 to provide a second control signal to the controller 140 based on comparison of the output voltage and the input signal.

The monitor 160 may detect the input signal $V_{IN}$ to generate the first control signal, which may represent a voltage range state. The monitor 160, may receive the input signal $V_{IN}$, and may generate output data that may be input to the power stage 150 as control data. The monitor 160 may compare $V_{IN}$ to a number of threshold voltages, for example a high threshold (VHI) and a low threshold (VLO). For example, the monitor 160 may include a set of comparators 162, 164. The control data may be generated from a comparison of the input voltage $V_{IN}$ to each of these threshold voltages VHI, VLO.

If $V_{IN}$ is above VHI, the monitor 160 may set the operational voltage in a first range (called "high positive" herein) representing an output modulation range that switches between $+V_{PP}$, $+V_{DD}$, and GND. If $V_{IN}$ is between VHI and VLO, the monitor 160 may set the operational voltage in a second range (called "crossing zero" herein) representing an output modulation range that switches between $+V_{DD}$, GND, and $-V_{DD}$. If $V_{IN}$ is below VLO, the monitor 160 may set the operational voltage in a range (called "high negative" herein) representing an output modulation range that switches between GND, $-V_{DD}$, and $-V_{PP}$. The operational voltage range may be encoded by any known alpha-numerical encoding method. For example, the three narrow voltage states may be represented as +1, 0, and −1.

In an embodiment, the threshold voltages VHI and VLO may be set to $06*V_{DD}/GA_{IN}$ and $-0.6*V_{DD}/GA_{IN}$, where $GA_{IN}$ represents an amplification factor of the system 100. Of course, different threshold values may be developed to suit different application needs.

The feedback system 170 may include an combiner 110, a tuner 120, and a quantizer 130.

The quantizer 130 may generate the second control signal. The quantizer 130 may receive the first control signal from the monitor 160 to integrate the operational voltage range into its quantization operations. The operational voltage range from the monitor 160 may be also received by the controller 140 for additional processing.

The controller 140 may control the power stage 150 to generate an output of modulated pulses, where each modulated pulse of the output has a maximum voltage and a minimum voltage at adjacent pairs of $+V_{PP}$, $+V_{DD}$, GND, $-V_{DD}$, and $-V_{PP}$.

The combiner 110 may combine an input signal $V_{IN}$ with the output signal $V_{OUT}$, for example, by comparing $V_{IN}$ to $V_{OUT}$. The input signal $V_{IN}$ and the output signal $V_{OUT}$ may each be a pair of signals with a voltage potential relative to each other. The combiner 110 may output a ΔV signal representing a result of this comparison to the tuner 120. For example, $V_{OUT}$ may be a pair of signals VOUT1 and VOUT2, with the voltage potential value of $V_{OUT}$ being VOUT1-VOUT2.

The tuner 120 may output a filtered and amplified signal to a quantizer 130. The tuner 120 may remove high frequency noise from the signal received from the combiner 110, and amplify useful signal. For example, the tuner 120 may include a low pass filter or a bandpass filter, and an amplifier.

The quantizer 130 may quantize the voltage level of the signal received from the tuner 120, to generate an one-bit quantization code representing two quantization states, which for convenience may be represented numerically as +1 and −1. The quantization code represents a sequence of modulated pulses. The quantizer 130 may be for example an one-bit quantizer.

The controller 140 may receive the quantization code for additional processing. In an embodiment, the controller 140 may generate a pulse modulated (PM) control signal to activate the power stage 150 to generate an output of pulses, modulated between a maximum voltage and a minimum voltage of two adjacent voltage levels of more than three distinct voltage levels, and the pulses have more than two distinct combination of the maximum voltage and the minimum voltage as two adjacent voltage levels of more than three distinct voltage levels.

For example, if the PM control signal's five modulation states (+2, +1, 0, −1, −2) correspond to $+V_{PP}$, $+V_{DD}$, GND, $-V_{DD}$, and $-V_{PP}$ in $V_{OUT}$, the PM control signal may thus be modulated in these four possible combinations of modulation states (+2, +1), (+1, 0), (0, −1), and (−1, −2). Then, correspondingly, $V_{OUT}$ may be an output of pulses, modulated in these four possible combinations of maximum and minimum voltages $(+V_{PP}, +V_{DD})$, $(+V_{DD}, GND)$, $(GND, -V_{DD})$, and $(-V_{DD}, -V_{PP})$. That means that, for each modulated pulse in the output signal $V_{OUT}$, the pulse amplitude, between the maximum and the minimum voltages, may be small.

Figure 4:
FIG. 4 illustrates an exemplary simulated output voltage pattern generated from an amplifier according to an embodiment of the present disclosure.

An example of the output $V_{OUT}$ according to the embodiment of the present disclosure is illustrated in the output diagram 400 in FIG. 4.

Accordingly, because the pulse amplitude of the output signal $V_{OUT}$ may be small, the amplifier would have increased power efficiency, less stress on the amplifier components, less EMI generation, and lower quantization error.

FIG. 2 is a circuit diagram of a power stage 200 according to an embodiment of the present disclosure. The power stage 200 may find application as the power stage 150 of FIG. 1. The power stage 200 may include multiple switches 252.1, 252.2, 254.1, 254.2, 256.1, and 256.2 that are coupled to output terminals OUT1, OUT2 of the power stage 200. First switches 252.1, 252.2 may be connected between a $V_{DD}$ voltage source and a respective terminal OUT1, OUT2. Second switches 254.1, 254.2 may be connected between a second voltage source $V_{PP}$ and a respective output terminal OUT1, OUT2. Third switches 256.1, 256.2 may be connected between a third voltage source VSS (shown as ground GND) and a respective output terminal OUT1, OUT2. Each of the switches 252.1, 252.2, 254.1, 254.2, 256.1, and 256.2 may receive a respective PM control signal from an external source, such as the controller 140 of FIG. 1.

To drive switched output voltages across the load 260 between $+V_{DD}$ and $+V_{PP}$, transistor switches 254.1 and 252.1 may be switched off and on in an opposing manner while transistor switch 256.2 may be held on. To drive switched output voltages across the load 260 between $+V_{DD}$ and 0V, transistor switches 252.1 and 256.1 may be switched off and on in an opposing manner while transistor switch 256.2 may be held on. To drive switched output voltages across the load between 0V and $-V_{DD}$, transistor switches 252.2 and 256.2 may be switched off and on in an opposing manner while transistor switch 256.1 may be held on. To drive switched output voltages across the load between $-V_{DD}$ and $-V_{PP}$, transistor switches 254.2 and 252.2 may be switched off and on in an opposing manner while transistor 256.1 may be held in the on-state. In this example, $V_{OUT}$ may be the voltage potential between OUT1 and OUT2. Other variations of the power stage may be possible.

Figure 3:
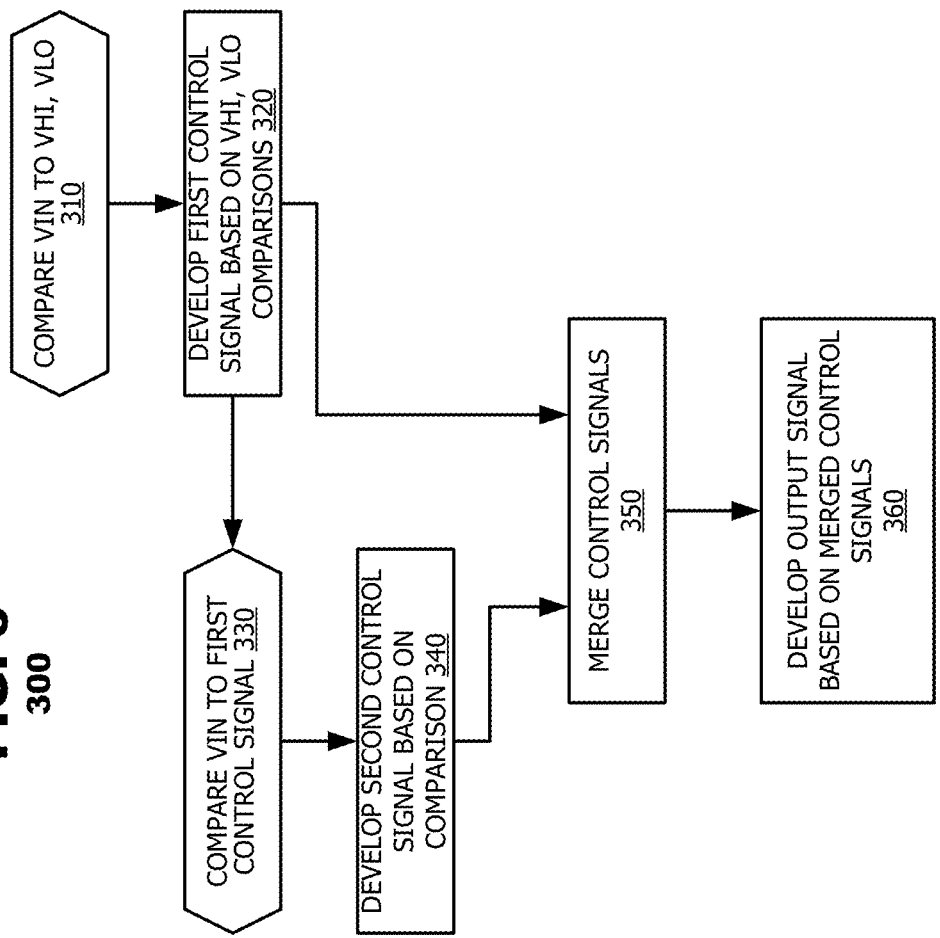
FIG. 3 illustrates a method for generating an output signal according to an embodiment of the present disclosure.

FIG. 3 illustrates a method 300 for generating a narrow voltage range modulated multi-level output voltage from an input signal, according to an embodiment of the present disclosure. The input signal $V_{IN}$ may be compared to threshold voltages, such as VHI and VLO (block 310). A first control signal may be developed based on the comparison of $V_{IN}$ to the threshold voltages (block 320). The input signal $V_{IN}$ may be compared to the first control signal (block 330). A second control signal may be developed based on the comparison of $V_{IN}$ to the first control signal of block 320 (block 340). The first control signal and the second control signal may be merged (block 350). Output signal may be developed based on the merged control signals (block 360), wherein a maximum voltage and a minimum voltage of each of the plurality of the pulses may be two adjacent voltage levels of more than three distinct voltage levels, and the plurality of the pulses has more than two distinct combination of the maximum voltage and the minimum voltage as two adjacent voltage levels of more than three distinct voltage levels.

In another embodiment, the controller may execute instructions stored in a non-transitory computer readable medium to perform the method 300 illustrated in FIG. 3.

The output voltage may be modulated according to pulse-density modulation ("PDM"), pulse-width modulation ("PWM"), and the like, and the frequency of the modulation may be varied.

The controller 140 in FIG. 1 may integrate the quantization code with a delayed version of the quantization code. The quantization code may be passed through a delay element (not shown), to generate the delayed version of the quantization code. The quantization code may be integrated with the delayed version of the quantization code by a summer (not shown) or an adder (not shown). This may generate a hysteresis quantization code that is modulated between three states, for example represented by +1, 0, −1. The controller 140 may integrate the hysteresis quantization code (+1, 0, −1) with the operational voltage range (+1, 0, −1), to generate a PM control signal modulated between five possible states, for example represented as +2, +1, 0, −1, −2.

The PM control signal may be decoded into switching signals received by a power stage 150 to activate multiple sets of transistors or switches to switch the output signal $V_{OUT}$ to multiple voltage levels. The PM control signal's five modulation states (+2, +1, 0, −1, −2) may each correspond to a distinct voltage level of the output signal $V_{OUT}$, but the multiple voltage levels of the output signal $V_{OUT}$ may not necessarily be scaled to match the PM control signal's numerical representation. For example, the PM control signal's five modulation states (+2, +1, 0, −1, −2) may correspond to $+V_{PP}$, $+V_{DD}$, GND, $-V_{DD}$, and $-V_{PP}$ in $V_{OUT}$, where $V_{DD}$=3.5 volts and $V_{PP}$=5 volts. Additionally, the multiple voltage levels of the output signal $V_{OUT}$ need not be evenly distributed or balanced between negative and positive voltage levels. For example, $V_{OUT}$ may have the multiple voltage levels of +9, +7.5, +5, 0, and −3 volts. Other variations of multiple voltage levels of output signal $V_{OUT}$ may be possible.

Additionally, while the embodiment described in the example above illustrates the PM control signal having five possible modulation states, corresponding to five possible modulation voltage levels in the output signal $V_{OUT}$, additional number of modulation states and modulation voltage levels can be implemented in an amplifier with an one-bit quantizer, with consideration of optimizations and trade-offs of performance, design complexity, etc. For example, seven (or nine) modulation states and modulation voltage levels may be possible, by using the one-bit quantizer 130 and adding additional thresholds and operational voltage ranges in the monitor 160.

In an embodiment, the upper half pairs of transistors switches 252.1, 252.2, 254.1, 254.2 may be configured as PMOS transistor switches and the lower half pair of transistor switches 256.1, 256.2 may be configured as NMOS transistor switches. In another embodiment, the upper half pairs of transistor switches 252.1, 252.2, 254.1, 254.2 may be configured as NMOS transistor switches and the lower half pair of transistor switches 256.1, 256.2 may be configured as NMOS transistor switches.

In another embodiment, the upper half pairs of transistor switches 252.1, 252.2, 254.1, 254.2 may be configured as P-type field effect transistors ("FETs") and the lower half pair of transistor switches 256.1, 256.2 may be configured as N-type FETs. In another embodiment, the upper half pairs of transistor switches 252.1, 252.2, 254.1, 254.2 may be configured as N-type FETs and the lower pair of transistor switches 256.1, 256.2 may be configured as N-type FETs.

Several embodiments of the present disclosure are specifically illustrated and described herein. However, it will be appreciated that modifications and variations of the present disclosure may be covered by the above teachings. In other instances, well-known operations, components and circuits have not been described in detail so as not to obscure the embodiments. It can be appreciated that the specific structural and functional details disclosed herein may be representative and do not necessarily limit the scope of the embodiments.

Those skilled in the art may appreciate from the foregoing description that the present disclosure may be implemented in a variety of forms, and that the various embodiments may be implemented alone or in combination. Therefore, while the embodiments of the present disclosure have been described in connection with particular examples thereof, the true scope of the embodiments and/or methods of the present disclosure should not be so limited since other modifications will become apparent to the skilled practitioner upon a study of the drawings, specification, and following claims.

We claim:

1. An amplifier system, comprising:
   a power stage having inputs for three different supply voltages and an output for coupling to a load;
   a controller to generate control signals to the power stage that cause the power stage to vary an output voltage applied to the load among more than three distinct voltage levels;
   a monitor to provide a first control signal to the controller based on an input voltage signal; and
   a feedback system to provide a second control signal to the controller based on comparison of the output voltage and the input voltage signal.

2. The amplifier system of claim 1, wherein the feedback system comprises an one-bit quantizer.

3. The amplifier system of claim 2, wherein the one-bit quantizer comprises a plurality of comparators.

4. The amplifier system of claim 1, wherein the second control signal represents two quantization states.

5. The amplifier system of claim 1, wherein the controller generates the control signals by integrating the second control signal with a delayed code of the second control signal, to generate a hysteresis code, and integrating the hysteresis code with the first control signal.

6. The amplifier system of claim 1, wherein the power stage comprises a plurality of pairs of switches that switches the output between a plurality of maximum voltages and a plurality of minimum voltages.

7. The amplifier system of claim 1, further comprising a voltage booster powered by $V_{DD}$ to generate $V_{PP}$.

8. The amplifier system of claim 1, wherein the first control signal represents more than two voltage range states.

9. The amplifier system of claim 1, wherein the feedback system comprises a summer having inputs for the input voltage signal and inputs coupled to the output; and a filter receiving an output from the summer.

10. The amplifier system of claim 1, wherein the controller generates the control signals according to pulse-density modulation, and the output voltage comprising a plurality of pulses,
   wherein a maximum voltage and a minimum voltage of each of the plurality of pulses are two adjacent voltage levels of more than three distinct voltage levels, and the plurality of the pulses has more than two distinct combination of the maximum voltage and the minimum voltage as two adjacent voltage levels of more than three distinct voltage levels.

11. The amplifier system of claim 1, wherein the monitor to provide the first control signal to the controller based directly on the input voltage signal.

12. A method, comprising:
generating an output voltage to a load, by a power stage having inputs for three different supply voltages;
generating control signals to the power stage, by a controller, to cause the power stage to vary the output voltage applied to the load among more than three distinct voltage levels;
providing a first control signal to the controller, by a monitor, based on an input voltage signal; and
providing a second control signal to the controller, by a feedback system, based on comparison of the output voltage and the input voltage signal.

13. The method of claim 12, wherein the feedback system comprises an one-bit quantizer.

14. The method of claim 13, wherein the one-bit quantizer comprises a plurality of comparators.

15. The method of claim 12, wherein the second control signal represents two quantization states.

16. The method of claim 12, wherein the controller generates the control signals by integrating the second control signal with a delayed code of the second control signal, to generate a hysteresis code, and integrating the hysteresis code with the first control signal.

17. The method of claim 12, wherein the power stage comprises a plurality of pairs of switches that switches the output between a plurality of maximum voltages and a plurality of minimum voltages.

18. The method of claim 12, further comprising a voltage booster powered by $V_{DD}$ to generate $V_{PP}$.

19. The method of claim 12, wherein the first control signal represents more than two voltage range states.

20. The method of claim 12, wherein the feedback system comprises a summer having inputs for the input voltage signal and inputs coupled to the output; and a filter receiving an output from the summer.

21. The method of claim 12, wherein the controller generates the control signals according to pulse-density modulation, and the output voltage comprising a plurality of pulses,
wherein a maximum voltage and a minimum voltage of each of the plurality of pulses are two adjacent voltage levels of more than three distinct voltage levels, and
the plurality of the pulses has more than two distinct combination of the maximum voltage and the minimum voltage as two adjacent voltage levels of more than three distinct voltage levels.

22. The method of claim 12, wherein the monitor to provide the first control signal to the controller based directly on the input voltage signal.

23. A non-transitory computer-readable medium storing instructions executable by a processor, the processor execute the instructions to:
generating an output voltage to a load, by a power stage having inputs for three different supply voltages;
generating control signals to the power stage, by a controller, to cause the power stage to vary the output voltage applied to the load among more than three distinct voltage levels;
providing a first control signal to the controller, by a monitor, based on an input voltage signal; and
providing a second control signal to the controller, by a feedback system, based on comparison of the output voltage and the input voltage signal.

24. The non-transitory computer-readable medium of claim 23, wherein the feedback system comprises an one-bit quantizer.

25. The non-transitory computer-readable medium of claim 24, wherein the one-bit quantizer comprises a plurality of comparators.

26. The non-transitory computer-readable medium of claim 23, wherein the second control signal represents two quantization states.

27. The non-transitory computer-readable medium of claim 23, wherein the controller generates the control signals by integrating the second control signal with a delayed code of the second control signal, to generate a hysteresis code, and integrating the hysteresis code with the first control signal.

28. The non-transitory computer-readable medium of claim 23, wherein the first control signal represents more than two voltage range states.

29. The non-transitory computer-readable medium of claim 23, wherein the feedback system comprises a summer having inputs for the input voltage signal and inputs coupled to the output; and a filter receiving an output from the summer.

30. The non-transitory computer-readable medium of claim 23, wherein the controller generates the control signals according to pulse-density modulation, and the output voltage comprising a plurality of pulses,
wherein a maximum voltage and a minimum voltage of each of the plurality of pulses are two adjacent voltage levels of more than three distinct voltage levels, and
the plurality of the pulses has more than two distinct combination of the maximum voltage and the minimum voltage as two adjacent voltage levels of more than three distinct voltage levels.

* * * * *